(12) United States Patent
Menezo et al.

(10) Patent No.: US 12,261,410 B2
(45) Date of Patent: Mar. 25, 2025

(54) SINGLE-MODE HYBRID III-V ON SILICON LASER OF SIMPLIFIED CONSTRUCTION

(71) Applicant: COMMISSARIAT A L'ENERGIE ATOMIQUE ET AUX ENERGIES ALTERNATIVES, Paris (FR)

(72) Inventors: Sylvie Menezo, Grenoble (FR); Joyce Poon, Toronto (CA); Torrey Thiessen, Toronto (CA)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 747 days.

(21) Appl. No.: 17/609,024

(22) PCT Filed: Apr. 24, 2020

(86) PCT No.: PCT/EP2020/061501
§ 371 (c)(1),
(2) Date: Nov. 5, 2021

(87) PCT Pub. No.: WO2020/224994
PCT Pub. Date: Nov. 12, 2020

(65) Prior Publication Data
US 2022/0216669 A1      Jul. 7, 2022

(30) Foreign Application Priority Data
May 9, 2019  (FR) .......................................  1904842

(51) Int. Cl.
*H01S 5/02*  (2006.01)
*H01S 5/0239*  (2021.01)
(Continued)

(52) U.S. Cl.
CPC ............ *H01S 5/021* (2013.01); *H01S 5/0239* (2021.01); *H01S 5/1032* (2013.01); *H01S 5/12* (2013.01); *H01S 5/125* (2013.01); *H01S 5/1014* (2013.01)

(58) Field of Classification Search
CPC ......... H01S 5/021; H01S 5/0215–0216; H01S 5/1032; H01S 5/1014; H01S 5/106; H01S 5/1064; H01S 5/12–125
See application file for complete search history.

(56) References Cited

U.S. PATENT DOCUMENTS 9,742,150 B1 *  8/2017  Hofrichter  .............. H01S 5/021
10,483,716 B2    11/2019  Menezo et al.
(Continued)

FOREIGN PATENT DOCUMENTS

CN        108075356 A     5/2018
EP        2 811 593 A1    12/2014
(Continued)

OTHER PUBLICATIONS

International Search Report mailed on Jun. 25, 2020 in PCT/EP2020/061501 filed on Apr. 24, 2020 (2 pages).
(Continued)

*Primary Examiner* — Sean P Hagan
(74) *Attorney, Agent, or Firm* — Oblon, McClelland, Maier & Neustadt, L.L.P.

(57) ABSTRACT

A laser device includes a III-V heterostructure amplifying medium; a silicon optical waveguide having a coupling section facing a central portion of the amplifying medium, a propagation section and a first transition section between the coupling section and the propagation section; and a first and a second reflective structure allowing a Fabry-Perot type resonant cavity to be formed between them for the amplifying medium. The coupling section includes a refractive
(Continued)

index disruption region provided with micro-reflectors designed to reduce the thickness and/or width of the coupling section. The first reflective structure is formed in a section of the waveguide with a first thickness. The second reflective structure is formed in a section of the waveguide, which has the first thickness and which is separated from the coupling section by a second transition section of the waveguide, the second transition section having a second thickness greater than the first thickness.

16 Claims, 7 Drawing Sheets

(51) Int. Cl.
*H01S 5/10* (2021.01)
*H01S 5/12* (2021.01)
*H01S 5/125* (2006.01)

(56) References Cited

U.S. PATENT DOCUMENTS

| | | | |
|---|---|---|---|
| 2004/0037342 A1* | 2/2004 | Blauvelt | H01S 5/12 372/102 |
| 2010/0327257 A1* | 12/2010 | Yamamoto | H01S 5/12 438/31 |
| 2014/0153600 A1* | 6/2014 | Luo | B82Y 20/00 372/40 |
| 2014/0369700 A1 | 12/2014 | Debregeas-Sillard et al. | |
| 2016/0056612 A1* | 2/2016 | Ferrotti | H01S 5/343 438/31 |
| 2016/0164257 A1* | 6/2016 | Adachi | H01S 5/1231 438/31 |
| 2016/0327759 A1* | 11/2016 | Keyvaninia | H01L 31/1035 |
| 2017/0098922 A1* | 4/2017 | Hatori | H04B 10/501 |
| 2017/0141541 A1 | 5/2017 | Ferrotti et al. | |
| 2018/0212080 A1* | 7/2018 | Meyer | H01L 31/105 |
| 2020/0067274 A1* | 2/2020 | Kurczveil | H01S 5/50 |

FOREIGN PATENT DOCUMENTS

| | | |
|---|---|---|
| EP | 3 168 946 A1 | 5/2017 |
| FR | 3 061 961 A1 | 7/2018 |
| JP | 2017-17112 A | 1/2017 |
| WO | WO 2018/117077 A1 | 6/2018 |

OTHER PUBLICATIONS

Preliminary French Search Report issued on Dec. 6, 2019 in French Application No. 1904842 filed on May 9, 2019 (2 pages; with Translation of Category).

U.S. Appl. No. 17/609,024, filed Nov. 5, 2021, including specification, claims and drawings (Menezo et al.).

U.S. Appl. No. 16/622,571, filed Dec. 13, 2019, including specification, claims and drawings (Menezo et al.).

U.S. Appl. No. 16/614,221, filed Nov. 15, 2019, including specification, claims and drawings (Menezo).

* cited by examiner

SINGLE-MODE HYBRID III-V ON SILICON LASER OF SIMPLIFIED CONSTRUCTION

TECHNICAL FIELD

This field of the invention is that of integrated photonic components which use both the properties of semiconductor materials capable of emitting light and those of semiconductor materials conventionally used in integrated circuits.

The invention relates more particularly to a hybrid on silicon laser which comprises a III-V heterostructure amplifying medium.

PRIOR ART

A hybrid III-V on silicon laser generally comprises:
- a gain structure which includes at least one III-V type heterostructure optical amplifying medium, the heterostructure being capable of emitting light and arranged so as to be overlying a section of a silicon waveguide to form therewith a hybrid waveguide section,
- an optical feedback structure for forming a resonant cavity for the amplifying medium, and
- optical transitions between the hybrid waveguide section and further silicon waveguide sections, particularly a laser-emitted light propagation section.

The term III-V type heterostructure denotes the use of materials that can be chosen from the following non-exhaustive list: InP, GaAs, InGaAlAs, InGaAsP, AlGaAs, InAsP. The heterostructure of such an amplifying medium, also known as gain medium, can include a stack of various layers, such as for example a stack of layers forming quantum wells sandwiched between a first doped layer, preferably N-doped, and a second doped layer, preferably P-doped.

In the case of a distributed feedback laser (known as a DFB laser), the optical feedback structure consists of a distributed reflector, such as a Bragg grating, under or in the gain structure, forming a wavelength selective mirror. In the case of a distributed Bragg reflector laser (known as a DBR laser), the optical feedback structure consists of reflectors disposed in the waveguide, on either side of the hybrid waveguide section.

FIGS. 1A-D represent a simplified top view of a DFB laser, this top view being accompanied by three sections taken transversely to the direction of light propagation which illustrate different regions of the laser.

The DFB laser comprises a III-V heterostructure amplifying medium formed for example of a stack QW of quantum wells sandwiched between an N-doped InP layer 1 and a P-doped InP layer 2. The thickness of the sandwich formed by the layers 1 and 2 and the quantum well stack QW is typically between 2 and 3 µm. The laser comprises a silicon optical waveguide. It consists for example of a rib waveguide which comprises a slab waveguide 3 topped with a rib 4. The waveguide comprises a coupling section 41 facing a central portion of the amplifying medium, two transition sections 42, 43 arranged on either side of the coupling section 41 and two propagation sections 44, 45, each optically coupled to one of the transition sections 42, 43. The transition sections 42, 43 are dimensioned so as to virtually have no transmission loss and no reflectivity between the coupling section 41 and the corresponding propagation section 44, 45. As known from the prior art, the rib waveguide 3, 4 is thick for this purpose (the cumulative thickness of the slab 3 and the rib 4 is thus typically greater than or equal to 400 nm, or to 500 nm) and the transition sections 42, 43 are wider than the propagation sections 44, 45 (typically 400 nm wide for a thickness of 500 nm). A Bragg grating is formed in the coupling section 41 to supply the optical feedback. The light from the laser cavity is thus coupled with the silicon guide and propagated at the output along the arrows F1 and F2 from each of the propagation sections 44, 45.

The Bragg grating is typically formed by etching first-order quarter-wave structures $$\frac{\lambda_{m0}}{4.n_{eff}}$$

formed in the rib 4 at a period $$\frac{\lambda_{m0}}{2.n_{eff}}$$

where $\lambda_{m0}$ is the wavelength in vacuum, and $n_{eff}$ is the effective hybrid guide index (section AA). The Bragg grating can be designed to perform single-mode operation of the laser device by introducing at the centre of the coupling section a segment S acting as a quarter-wave type phase jump. For a wavelength $\lambda_{m0}$ in vacuum of 1310 nm and a standard index $n_{eff}$ of about 3.25, the period of the Bragg grating is typically about 200 nm. The manufacture of such a grating requires high-resolution lithography and therefore remains relatively complex to control.

Figure 1A:
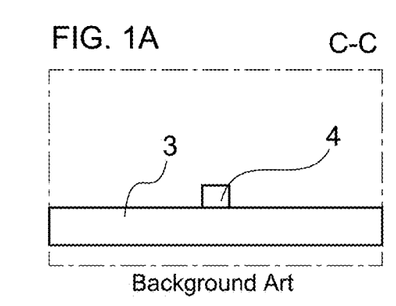
FIGS. 1A-D, already discussed above, are diagrams of a DFB laser on a hybrid III-V/Si platform.
Figure 1B:
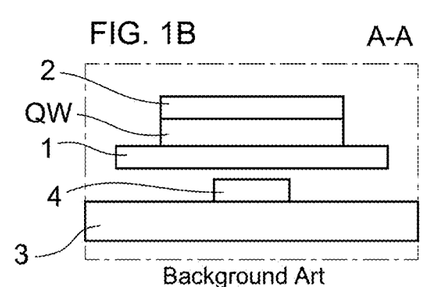
Figure 1C:
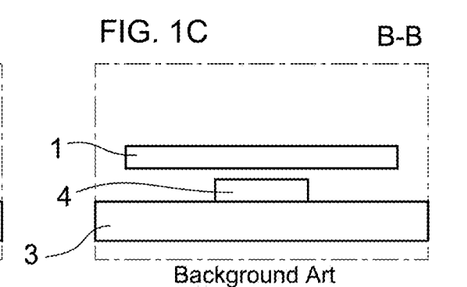
Figure 1D:
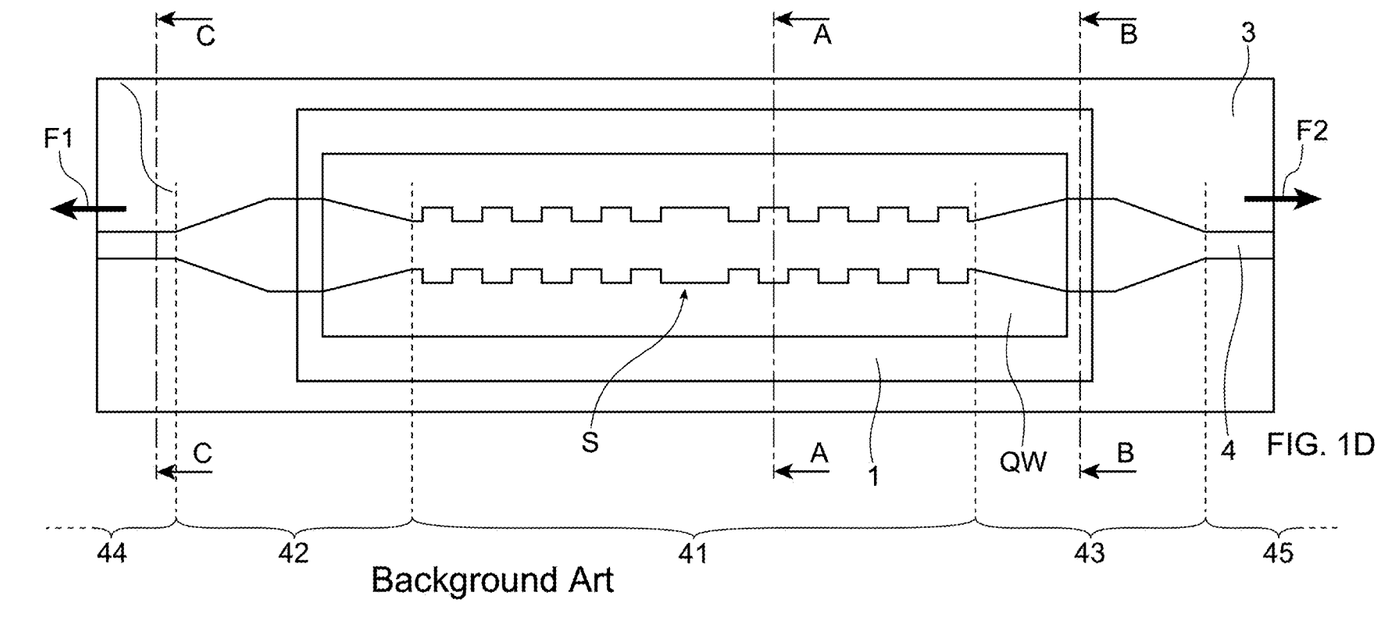
Figure 2:
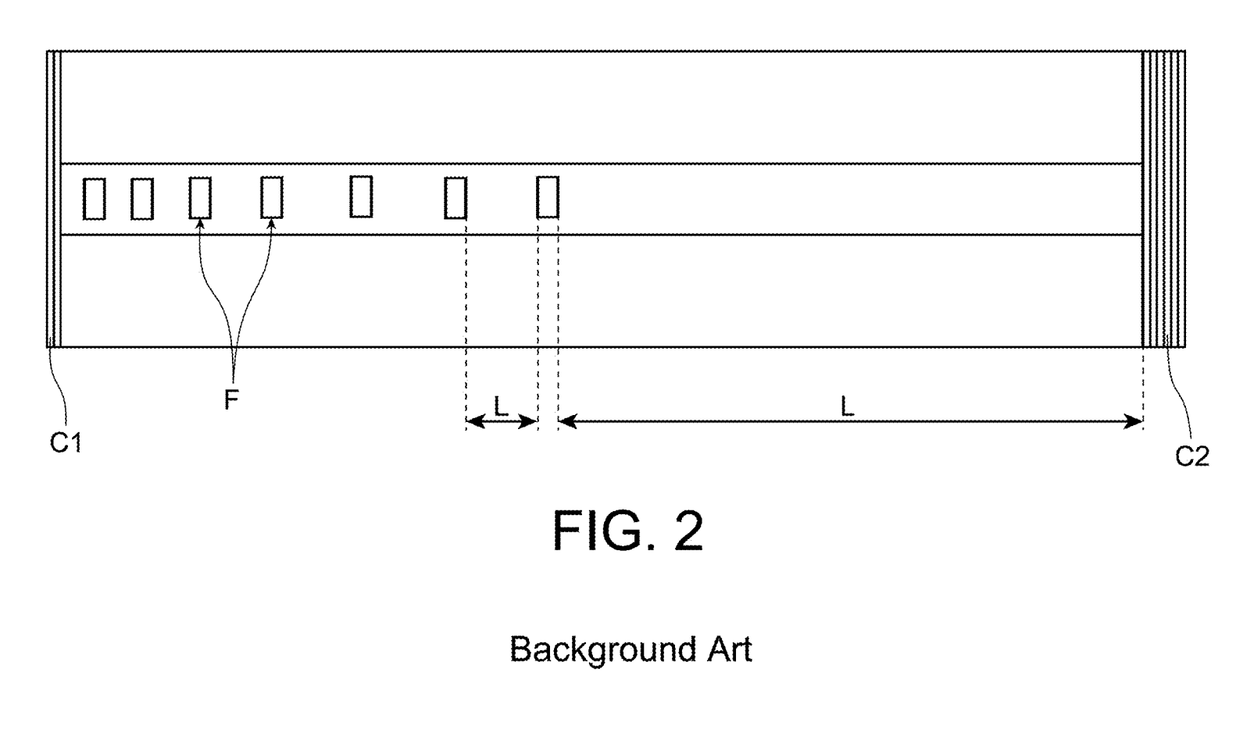
FIG. 2, already discussed above, is a diagram of a DML laser on an InP substrate.
Figure 3A:
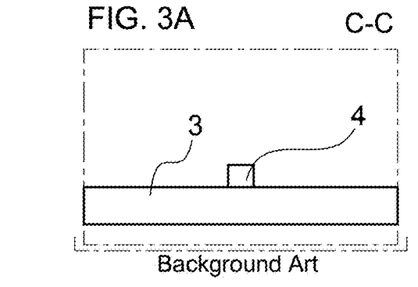
FIGS. 3A-D, already discussed above, are diagrams of a DBR laser on a hybrid III-V/Si platform.
Figure 3B:
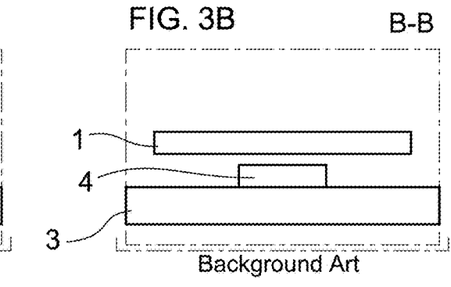
Figure 3C:
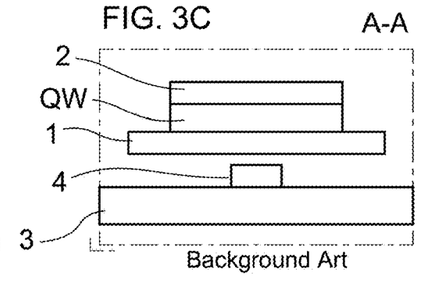
Figure 3D:
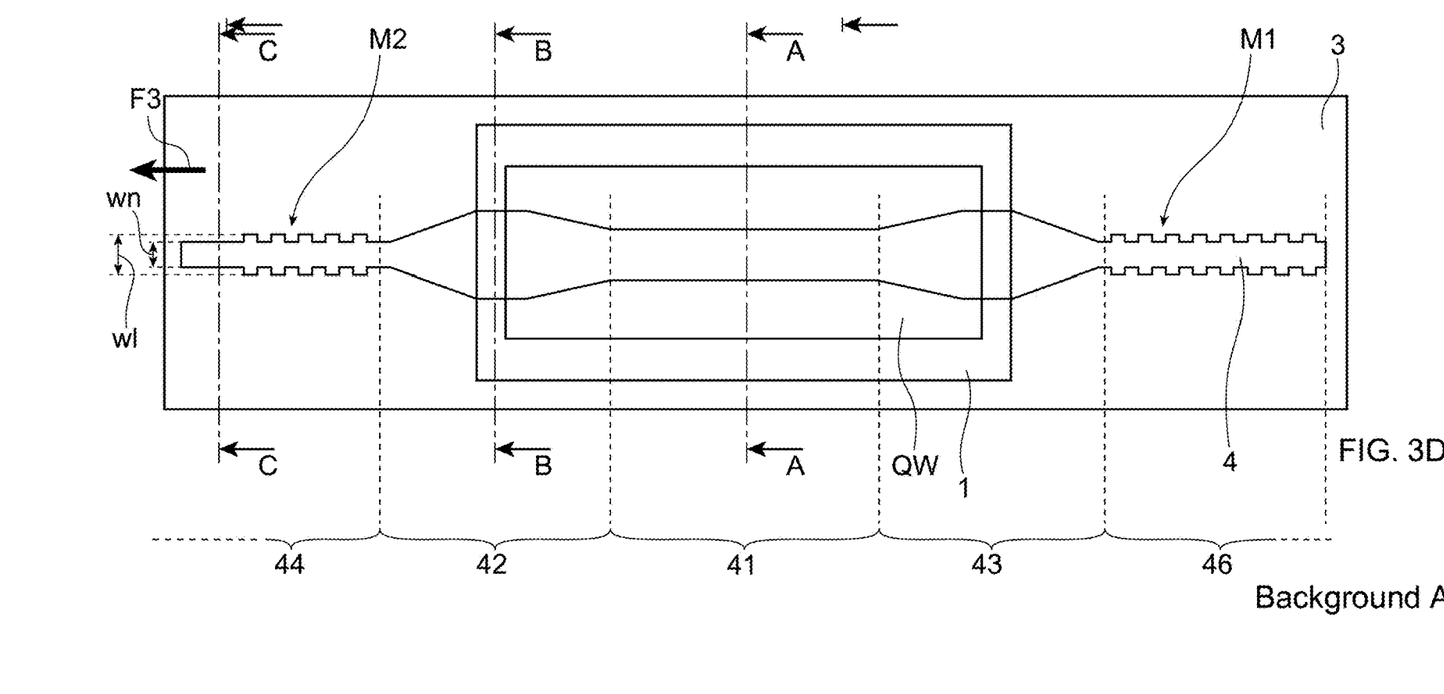
Figure 4A:
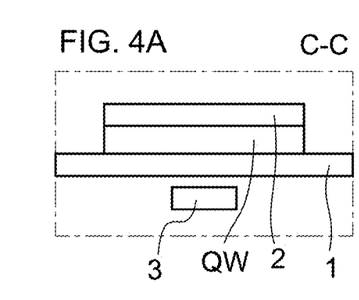
FIGS. 4A-E are a top view of a laser according to a first possible embodiment of the invention accompanied by four sections taken transversely to the direction of light propagation which illustrate different regions of the laser.
Figure 4B:
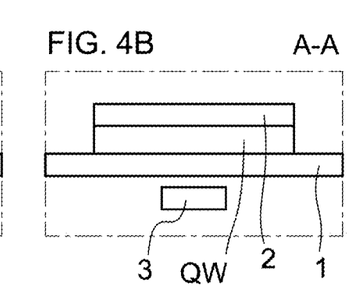
Figure 4C:
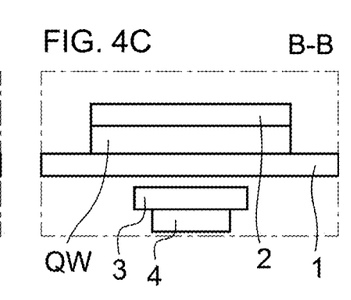
Figure 4D:
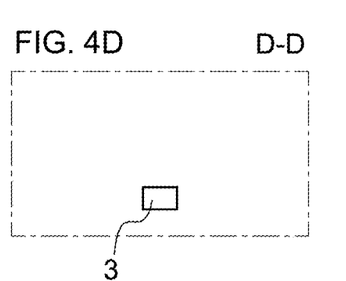
Figure 4E:
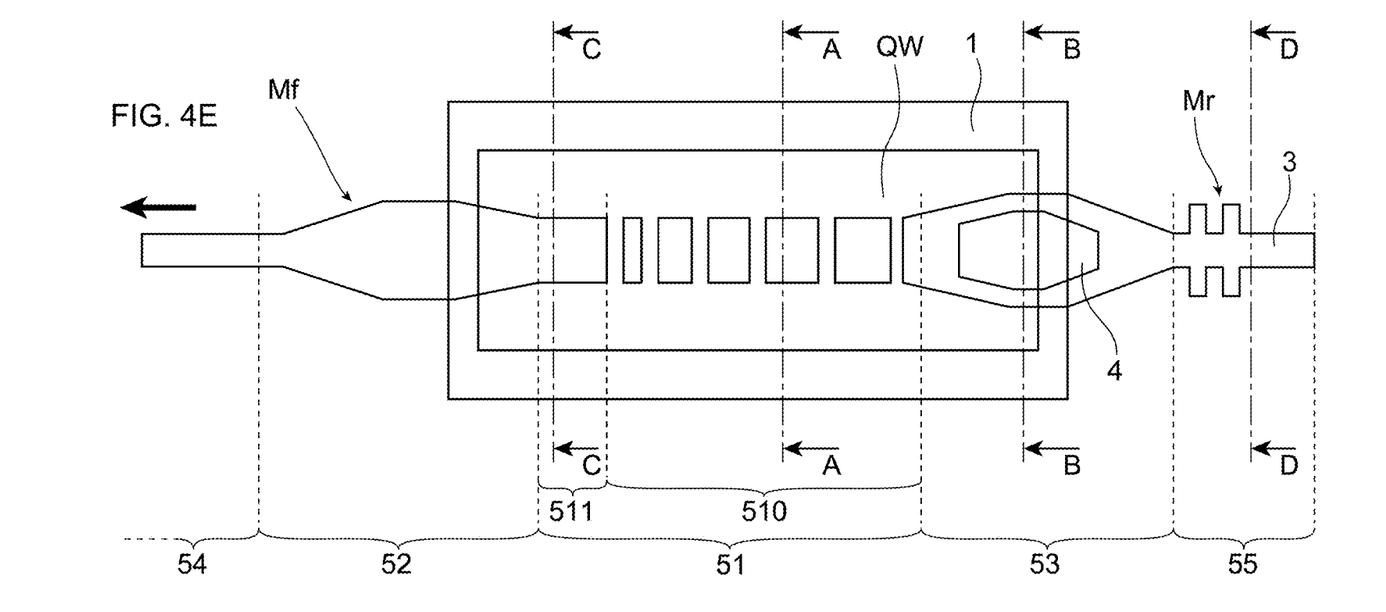

Moreover, single-mode lasers are known with a quantum well structure supported on an InP substrate which can be manufactured by means of lower-resolution lithography. As represented in FIG. 2, these lasers use for a feedback structure mirrors C1, C2 taking the form of cleaved facets of a waveguide. The single-mode operation of these lasers, known as Discrete Mode Lasers (DML), is provided by means of refractive index disturbances created by etching slots F along the rib of the waveguide coupled with the quantum well structure. The slots are formed such that the length L of all the optical paths (slot lengths, distances between the slots, distances between the slots and the mirrors) observes $$L = (2.S + 1)\frac{\lambda_{m0}}{4.n_{eff}},$$

where S is a natural integer (0, 1, 2 . . . ), $\lambda_{m0}$ the wavelength in vacuum for the laser mode and $n_{eff}$ the effective index at the slots. Thus, L is an odd number of the quarter-wave of the mode $$\frac{\lambda_{m0}}{4.n_{eff}}.$$

An additional quarter-wave phase shift, equivalent to the segment S of the DFB laser, can be introduced where necessary between slots or between slot and mirror.

Compared with a DFB laser manufactured on an InP substrate, the DML laser has a superior selectivity which is conveyed by narrower line widths and a reduced sensitivity to external reflections. The DML laser can be manufactured using low-resolution lithography because the lengths of the slots and the distances separating them can be higher-order cavities $$\left(3*\frac{\lambda_{m0}}{4.n_{eff}} \text{ or } 5*\frac{\lambda_{m0}}{4.n_{eff}} \text{ for example}\right).$$

Indeed, the loss of radiation due to these higher-order cavities is less prejudicial to a DML laser than to a DFB laser, the DM laser requiring a markedly lower number of slots (generally less than 100) than the number of teeth of the Bragg grating of a DFB laser (about 2000 teeth for a 400 µm long grating). In such a DML laser, the slots are created by lithography and etching in the InP material above the active zone. The relative positioning of one slot to another is thus very well controlled. On the other hand, it is impossible to exactly control the position of the mirrors C1, C2 relative to the different slots, as these mirrors C1, C2 are obtained by cleavage with a cleavage precision of at best 10 µm. The positioning uncertainties of the mirrors in relation to the slots can result in malfunction of the laser.

A solution could consist of using, not cleaved facets, but the optical feedback structure adopted by DBR lasers, namely reflectors disposed in the silicon waveguide on either side of the hybrid waveguide section.

To this end, FIGS. 3A-D represent a simplified top view of a DFB laser, this top view being accompanied by three sections taken transversely to the direction of light propagation which illustrate different regions of the laser. The DBR laser comprises a III-V heterostructure amplifying medium formed for example of a stack QW of quantum wells sandwiched between an N-doped InP layer 1 and a P-doped InP layer 2. The laser comprises a silicon optical waveguide, for example a rib waveguide which comprises a slab waveguide 3 topped with a rib 4. The waveguide comprises a coupling section 41 facing a central portion of the amplifying medium, two transition sections 42, 43 arranged on either side of the coupling section 41, a propagation section 44 optically coupled to one of the transition sections 42 and a reflection section 46 optically coupled to the other transition section 43. The transition sections 42, 43 are dimensioned so as to virtually have no transmission loss and no reflectivity.

Two mirrors M1, M2 are arranged outside the amplifying medium to form the optical feedback structure. As represented in FIGS. 3A-D, it typically consists of Bragg gratings disposed on either side in relation to the III-V heterostructure amplifying medium, one M2 supported by the propagation section 44, the other M1 supported by the reflection section 46. The mirror M1 supported by the reflection section 46 has a high reflectivity (over 90%) whereas the mirror M2 supported by the propagation section 44 has a low reflectivity (less than 50%). The light from the laser cavity is thus coupled with the silicon guide and propagated at the output along the arrow F3 from the propagation sections 44.

Such a solution with two mirrors formed in the silicon waveguide outside the coupling section with the amplifying medium is however not satisfactory for the two following reasons.

So that the transition sections 42, 43 have no transmission loss or reflectivity, the rib waveguide 3, 4 is thick for this purpose with a cumulative thickness of the slab 3 and of the rib 4 typically greater than or equal to 400 nm, or to 500 nm. With a thickness of the slab 3 of 300 nm, a thickness of the rib 4 of 200 nm and considering the formation of a Bragg grating by reducing the width of the rib 4 from w1=1500 nm to wn=500 nm, the Bragg grating has a period of 200 nm for a wavelength of 1310 nm. As for the DFB laser, the manufacture of such a grating requires high-resolution lithography and therefore remains relatively complex to control.

Moreover, the reflection coefficient introduced for each elementary structure of the Bragg grating (micro-reflector) is low so that to obtain a high reflectivity, it is necessary to lengthen the grating. For example, a length of 18 µm is needed to attain a reflectivity of 97%. The mirrors M1, M2 thus lengthen the laser cavity (with respect to a DML laser made of InP, wherein the mirrors are cleaved facets disposed immediately at the end of the active zone of the laser) while it is sought generally to dispose the shortest possible laser cavity so that the spacing between each of the modes of the cavity is the widest possible and thus ensure laser operation without mode jumping.

DESCRIPTION OF THE INVENTION

The aim of the invention is to propose a single-mode laser device on a hybrid III-V/Si platform that can be manufactured with low-resolution lithography tools while ensuring operation of this laser device without mode jumping (i.e. by proposing a laser wherein the cavity is the shortest possible with regard to the active region).

To this end, the invention proposes a laser device comprising:
- a III-V heterostructure amplifying medium;
- a silicon optical waveguide which includes a coupling section facing a central portion of the amplifying medium, a propagation section and a first transition section arranged between the coupling section and the propagation section;
- a first and a second reflective structure allowing a Fabry-Perot type resonant cavity to be formed between them for the amplifying medium.

The coupling section comprises a refractive index disturbance region provided with micro-reflectors designed by reducing the thickness and/or the width of the coupling section, the micro-reflectors having a length of $$m*\frac{\lambda_{m0}}{4.n_{eff}}$$

and being separated from one another by a distance greater than $$n*\frac{\lambda_{m0}}{4.n_{eff}},$$

where m is an odd integer, n an integer, $\lambda_{m0}$ the wavelength in vacuum and $n_{eff}$ the effective index of the refractive index disturbance region.

The first reflective structure is formed in a section of the waveguide which has a first thickness.

The second reflective structure is formed in a section of the waveguide which has the first thickness and which is separated from the coupling section by a second transition section of the waveguide, the second transition section having a second thickness greater than the first thickness.

Certain preferred but non-restrictive aspects of this device are as follows:

The reflectivity of the second reflective structure is greater than the reflectivity of the first reflective structure;

The reflectivity of the second reflective structure (Mr) is greater than 90%;

The reflectivity of the first reflective structure is between 5% and 60%;

The second reflective structure is a Bragg grating;

The first thickness is between 50 and 300 nm and the second thickness is greater by at least 100 nm, preferably at least 150 nm, than the first thickness;

The first reflective structure is formed in the first transition section;

The first transition section has the second thickness;

The first reflective structure is a Bragg grating formed in the coupling section;

The first reflective structure is a Bragg grating formed in a section of the waveguide inserted between the propagation section and the first transition section;

The waveguide is a waveguide provided with a rib directed away from the amplifying medium;

The rib is located at the second transition section and, where applicable, at the first transition section.

BRIEF DESCRIPTION OF THE DRAWINGS

Further aspects, aims, advantages and features of the invention will emerge more clearly on reading the following detailed description of preferred embodiments thereof, given by way of non-restrictive example, and with reference to the appended drawings wherein.

DETAILED DESCRIPTION

With reference to FIGS. 4A to 7D, the invention relates to a laser device comprising a III-V heterostructure amplifying medium formed for example of a stack QW of quantum wells sandwiched between an N-doped InP layer 1 and a P-doped InP layer 2. The laser comprises under this amplifying medium a silicon optical waveguide, for example a slab waveguide 3 which can be topped, particularly locally, with a rib 4.

Figure 5:
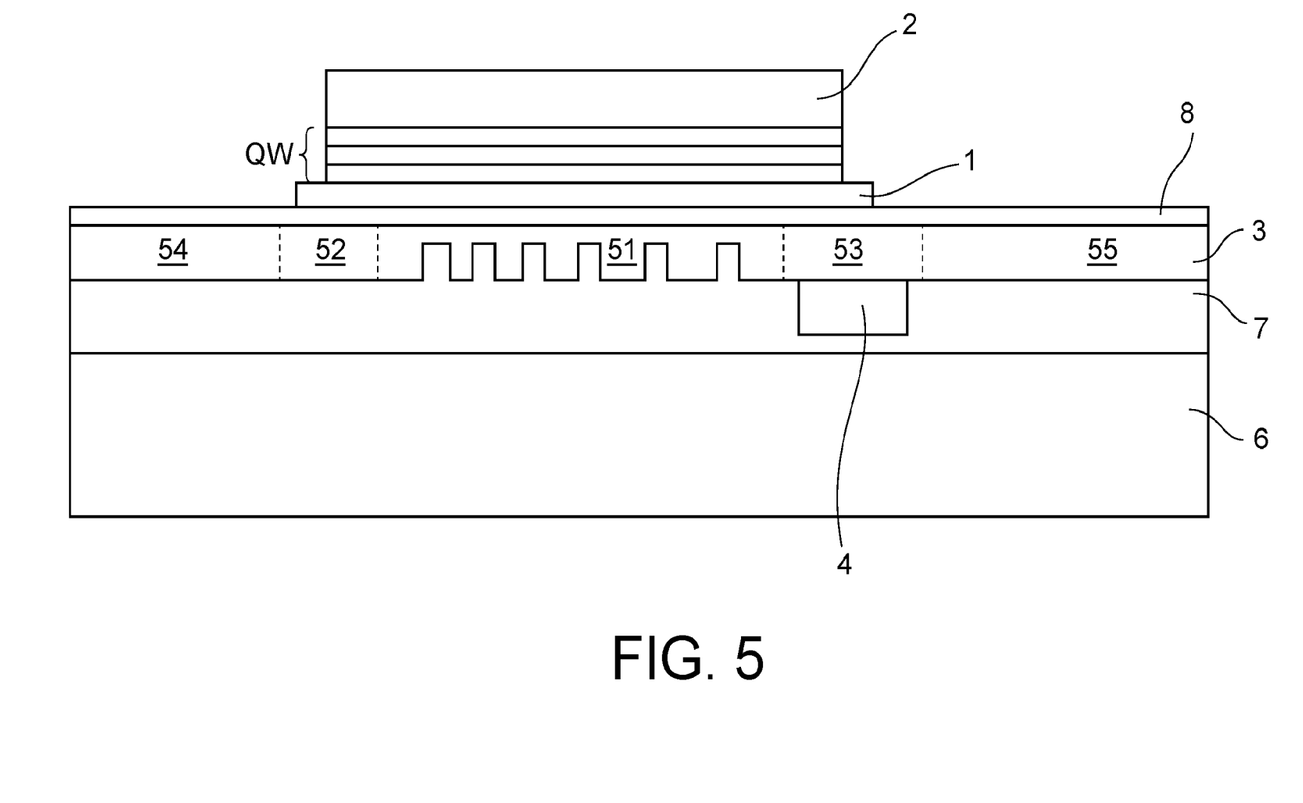
FIG. 5 is a longitudinal sectional view of the laser in FIG. 4E.
Figures 6A, 6B, 6C, 6D, 6E:
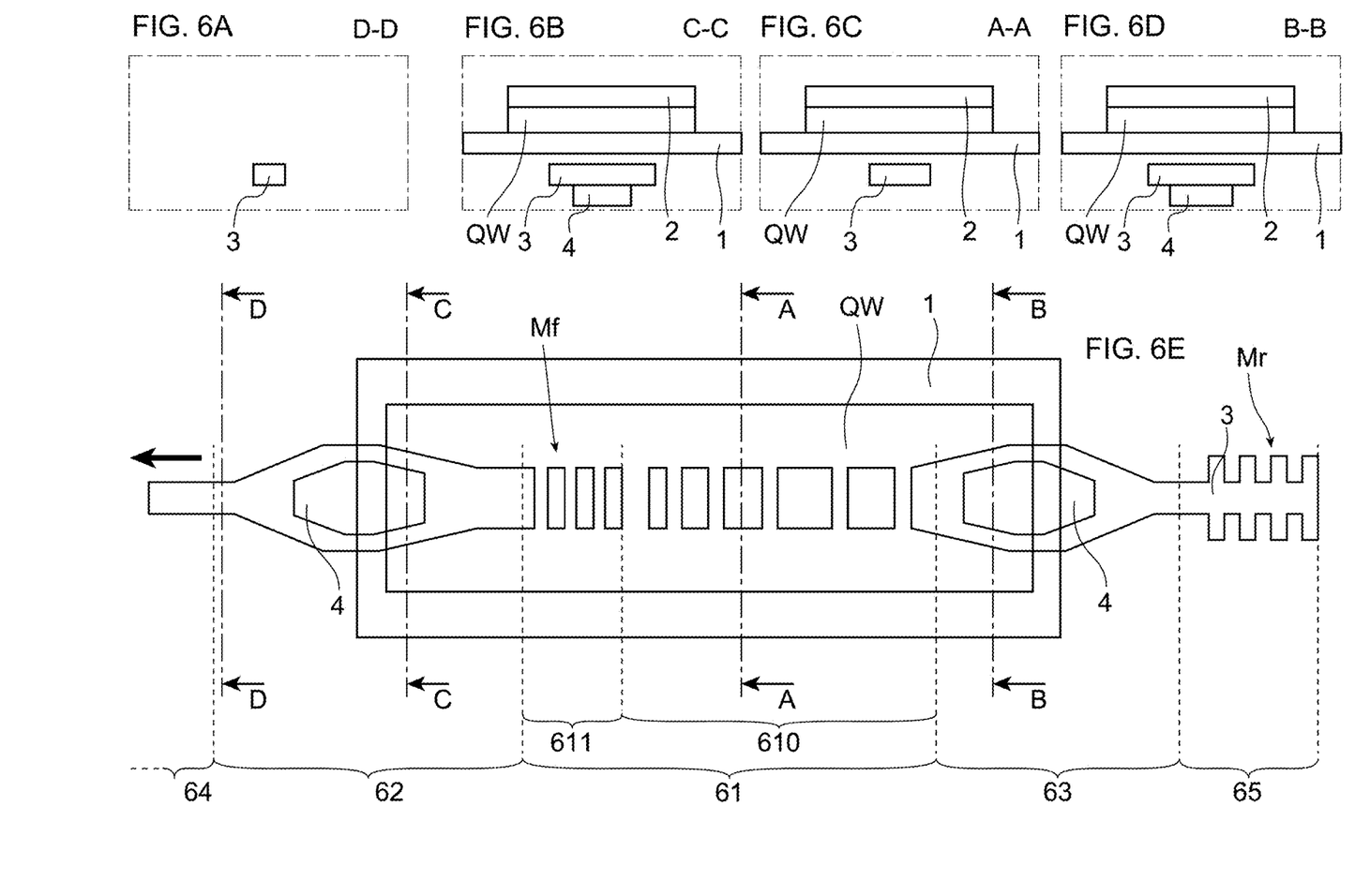
FIGS. 6A-E are a top view of a laser according to a second possible embodiment of the invention accompanied by four sections taken transversely to the direction of light propagation which illustrate different regions of the laser.

As illustrated in FIG. 5, the slab waveguide 3 can be formed in the superficial layer of a silicon-on-insulator substrate while being thus separated from a silicon substrate 6 by a buried insulator layer 7, typically made of SiO2. The waveguide is moreover covered with an insulator layer 8, typically made of SiO2, which particularly enables the bonding of the amplifying medium. As represented in the views in transverse sections B-B of FIGS. 4B, 6B and 7B, the slab waveguide 3 can be locally topped with a rib 4 directed away from the amplifying medium. In an alternative embodiment, this localised rib can be directed towards the amplifying medium.

The laser further comprises a first and a second reflective structure Mf, Mr allowing a Fabry-Perot type resonant cavity to be formed between them for the amplifying medium. These reflective structures will be described in more detail hereinafter, but it can already be noted that the reflectivity of the second reflective structure Mr can be greater than the reflectivity of the first reflective structure Mf. Such an asymmetry of reflectivity makes it possible to preferentially couple the light on one side of the laser cavity. The reflectivity of the second reflective structure Mr is preferably greater than 90%, whereas the first reflective structure Mf has a reflectivity preferably between 5% and 60%.

The waveguide comprises a coupling section 51, 61, 71 facing a central portion of the amplifying medium and a propagation section 54, 64, 74 serving as an output port for the light generated by the laser. The coupling section 51, 61, 71 comprises a refractive index disturbance region 510, 610, 71 provided with micro-reflectors designed so that the resonant cavity functions in a single-mode manner. These micro-reflectors are formed by reducing the thickness of the silicon waveguide and/or by reducing the width of the silicon waveguide. There are between 10 and 200. In the figures, these micro-reflectors are represented by slots in the silicon waveguide reducing the thickness. These micro-reflectors, for example similar to the slots present in a DML laser, are embodied as described above such that the micro-reflectors have a length of $$m * \frac{\lambda_{m0}}{4.n_{eff}}$$

and are separated from one another by a distance greater than $$n * \frac{\lambda_{m0}}{4.n_{eff}},$$

where m is an odd integer, n an integer, $\lambda_{m0}$ the wavelength in vacuum and $n_{eff}$ the effective index of the refractive index disturbance region. An additional quarter-wave phase shift, equivalent to the segment S of the DFB laser, can be introduced where necessary between micro-reflectors or between micro-reflector and mirror. The position of the micro-reflectors can for example be determined according to the approach presented in the article by S. O'Brien et al., "Spectral manipulation in Fabry-Perot lasers: perturbative inverse scattering approach," J. Opt. Soc. Am. B 23, 1046-1056 (2006). The coupling section 51, 51 can comprise one or more additional regions 511, 611 on either side of the refractive index disturbance region 510, 610.

The waveguide further comprises a first transition section 52, 62, 72 arranged between the propagation section 54, 64, 74 and the coupling section 51, 61, 71. It also comprises a so-called high-reflectivity reflection section 55, 65, 75 and a second transition section 53, 63, 73 arranged between the coupling section 51, 61, 71 and the high-reflectivity section 55, 65, 75.

According to the invention, the first reflective structure Mf is formed in a section of the waveguide which has a first thickness and the second reflective structure Mr is formed in a section of the waveguide which has the first thickness and which is separated from the coupling section 51, 61, 71 by the second transition section 53, 63, 73 of the waveguide, the second transition section having a second thickness greater than the first thickness. The first thickness can be between 50 and 300 nm and the second thickness is greater by at least 100 nm, preferably at least 150 nm, than the first thickness.

Within the scope of the first embodiment illustrated in FIGS. 4A-E and 5, the first transition section 52 forms the first reflective structure Mf of the resonant cavity.

Within the scope of the second and the third embodiment, the first reflective structure Mf of the resonant cavity is a Bragg grating supported by the waveguide inside (FIGS. 6A-E) or outside (FIGS. 7A-D) the coupling section 61, 71. The first transition section 62, 72 then has the second thickness.

In the second embodiment represented in FIGS. 6A-E, the Bragg grating forming the first reflective structure Mf is thus supported by the coupling section 61 outside the refractive index disturbance region 610, i.e. by an additional region 611 of the coupling section arranged between the refractive index disturbance region 610 and the first transition section 62.

Figures 7A, 7B, 7C, 7D:
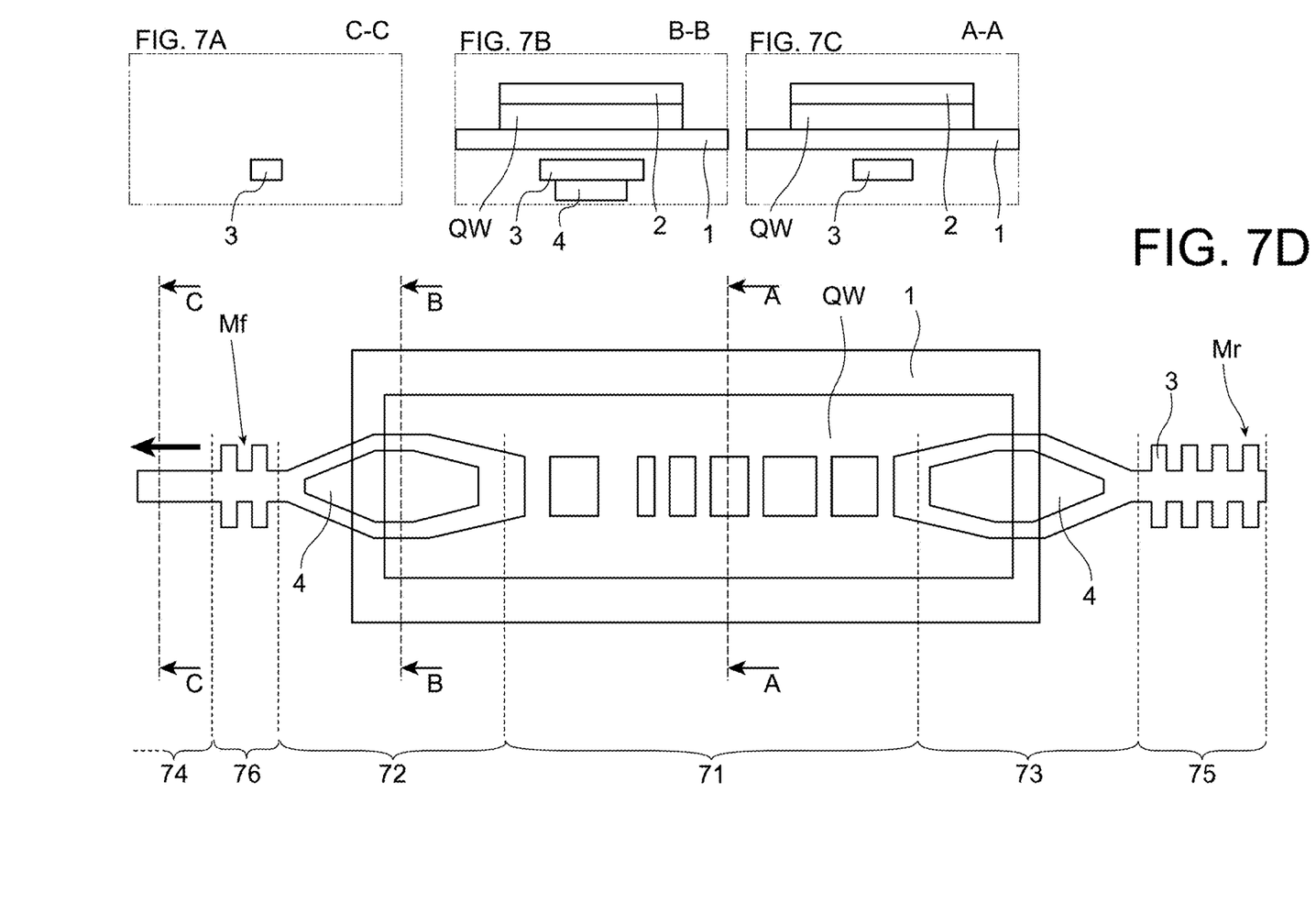
FIGS. 7A-D are a top view of a laser according to a third possible embodiment of the invention accompanied by three sections taken transversely to the direction of light propagation which illustrate different regions of the laser.

In the third embodiment represented in FIG. 7, the Bragg grating forming the first reflective structure Mf is for its part supported by a so-called low-reflectivity section 76 inserted between the first transition section 72 and the propagation section 74.

In these embodiments, the second reflective structure Mr can for its part be formed by a Bragg grating supported by the high-reflectivity section 55, 65, 75 of the waveguide, outside the coupling section 51, 61, 71 on the side opposite the first reflective structure Mf (alternatively the high-reflectivity Bragg grating can be supported inside the coupling section). The silicon waveguide can have a small thickness at the Bragg grating forming the second reflective structure Mr, as well as where applicable at the Bragg grating forming the second reflective structure Mr. It then proves to be possible to embody Bragg gratings wherein the period is greater than in the prior art (typically more than 220 nm, for example 227 nm with a waveguide thickness of 220 nm and a wavelength of 1310 nm) which makes it possible to relax the manufacturing constraints, while having high reaction forces which makes it possible to reduce the length of the grating (again according to the same example, a grating 10 μm in length makes it possible to attain a reflectivity of 97%).

Also, unlike known DML lasers for which the facet position is defined by cleavage, the two reflective structures of the invention can be defined by lithography which enables better control of the positioning of these structures with respect to the micro-reflectors in the coupling section. Moreover, the first reflective structure of the first embodiment has a reduced length with respect to a conventional Bragg grating which makes it possible to design a laser cavity of even more reduced length.

Whereas relatively thin silicon waveguides (100 nm to 300 nm typically) are conventionally used for silicon photonic components (in respect of guidance or modulation for example), it is known that hybrid III-V/Silicon lasers require relatively large thicknesses (typically 500 nm) to design adiabatic transition sections (i.e. with no losses). The width of the waveguide is also reduced/increased in these transition sections. As illustrated by sections B-B in FIGS. 4B, 6B and 7B, the waveguide thus has in the second transition section 53, 63, 73 (and in the first transition section 62, 72 within the scope of the second and third embodiment) a width which is for example 3 μm (comparable to the width of the InP layer 2/quantum well stack QW) and a thickness which is for example 500 nm.

In order to form the first reflective structure by means of the first transition section 52 within the scope of the first embodiment, it is possible to adopt for it a thickness and/or a width less than the thickness and/or the width of the second transition section 53. Thus, the thickness of the first transition section 52 can be between 50 and 300 nm and/or the width thereof can be between 300 nm and 1 μm. As represented in FIG. 5, a difference in thickness between the first transition section 52 and the second transition section 53 can be obtained with an extra thickness of silicon 4 produced in the buried insulator layer 7 locally at the second transition section 53.

Similarly, within the scope of the second and the third embodiment, the Bragg grating forming the first reflective structure is supported by a section of the waveguide which has a thickness and/or a width less than the thickness and/or the width of the transition sections 62, 72 and 63, 73 and particularly a thickness between 50 and 300 nm and/or a width between 300 nm and 1 μm. A difference in thickness can particularly be obtained by means of an additional thickness of silicon 4 produced in the buried insulator layer 7 locally at the first transition section 62, 72 and locally at the section transition section 63, 73.

The invention claimed is:

1. A laser device comprising:
a III-V heterostructure amplifying medium;
a silicon optical waveguide which includes a coupling section facing a central portion of the amplifying medium, a propagation section and a first transition section arranged between the coupling section and the propagation section; and
a first and a second reflective structure allowing a Fabry-Perot type resonant cavity to be formed between them for the amplifying medium, wherein
the coupling section comprises a refractive index disturbance region provided with micro-reflectors configured by reducing one of a thickness and a width of the coupling section, the micro-reflectors having a length of $$m * \frac{\lambda_{m0}}{4.n_{\text{eff}}}$$

and being separated from one another by a distance greater than $$n * \frac{\lambda_{m0}}{4.n_{\text{eff}}},$$

where m is an odd integer, n is an integer, $\lambda_{m0}$ is a wavelength in vacuum and $n_{\text{eff}}$ is an effective index of the refractive index disturbance region;
the first reflective structure is formed in a section of the waveguide which has a first thickness; and
the second reflective structure is formed in a section of the waveguide which has the first thickness and which is separated from the coupling section by a second transition section of the waveguide, the second transition section having a second thickness greater than the first thickness.

2. The laser device according to claim 1, wherein a reflectivity of the second reflective structure is greater than a reflectivity of the first reflective structure.

3. The laser device according to claim 2, wherein the reflectivity of the second reflective structure is greater than 90%.

4. The laser device according to claim 2, wherein the reflectivity of the first reflective structure is between 5% and 60%.

5. The laser device according to claim 1, wherein the second reflective structure is a Bragg grating.

6. The laser device according to claim 1, wherein the first thickness is between 50 and 300 nm and wherein the second thickness is greater by at least 100 nm than the first thickness.

7. The laser device according to claim 1, wherein the first reflective structure is formed in the first transition section.

8. The laser device according to claim 1, wherein the first transition section has the second thickness.

9. The laser device according to claim 8, wherein the first reflective structure is a Bragg grating formed in the coupling section.

10. The laser device according to claim 8, wherein the first reflective structure is a Bragg grating formed in a section of the waveguide inserted between the propagation section and the first transition section.

11. The laser device according to claim 1, wherein the waveguide is a waveguide provided with a rib directed away from the amplifying medium.

12. The laser device according to claim 11, wherein the rib is located at the second transition section.

13. The laser device according to claim 12, wherein the first reflective structure is formed in the first transition section.

14. The laser device according to claim 11, wherein the rib is located at the first transition section and at the second transition section.

15. The laser device according to claim 14, wherein the first transition section has the second thickness.

16. The laser device according to claim 1, wherein the first thickness is between 50 and 300 nm and wherein the second thickness is greater by at least 150 nm than the first thickness.

* * * * *